United States Patent [19]
Becker et al.

[11] Patent Number: 5,899,749
[45] Date of Patent: May 4, 1999

[54] IN SITU ETCH PROCESS FOR INSULATING AND CONDUCTIVE MATERIALS

[75] Inventors: David S. Becker; Guy T. Blalock, both of Boise, Id.

[73] Assignee: Micron Technology, Inc., Boise, Id.

[21] Appl. No.: 08/820,301

[22] Filed: Mar. 18, 1997

Related U.S. Application Data

[63] Continuation of application No. 08/060,902, May 13, 1993, Pat. No. 5,691,246.

[51] Int. Cl.$^6$ .................................................. H01L 21/00
[52] U.S. Cl. ........................... 438/714; 438/711; 438/739
[58] Field of Search .................... 438/710, 711, 438/714, 720, 723, 738, 739, 742, 743, 637; 216/67, 79

[56] References Cited

U.S. PATENT DOCUMENTS

| | | | |
|---|---|---|---|
| 4,939,105 | 7/1990 | Langley | 437/228 |
| 5,013,398 | 5/1991 | Long | 156/643 |
| 5,094,712 | 3/1992 | Becker | 156/643 |
| 5,096,536 | 3/1992 | Cathey | 156/643 |
| 5,110,411 | 5/1992 | Long | 156/656 |
| 5,167,762 | 12/1992 | Carr et al. | 438/714 |
| 5,201,993 | 4/1993 | Langley | 156/643 |
| 5,259,924 | 11/1993 | Mathews et al. | 438/714 X |
| 5,330,928 | 7/1994 | Tseng | 437/52 |

OTHER PUBLICATIONS

David S. Becker and Guy Blalock, "A Method of Obtaining High Oxide to Nitride Selectivity in an MERIE Reactor", Electrochemical Society, Inc. Conference, May 1993, pp. 367–368.

K.H. Kusters and W. Sesselmann, "A Stacked Capacitor Cell with a Fully Self–Aligned Contact Process for High–Density Dynamic Random Access Memories", J. Electrochem, Soc., vol. 139, No. 8, Aug. 1992, pp. 2318–2320.

H. Itoh, Y. Miyagawa, M. Takahashi, T. Mitsuhashi, Y. Kimura, A. Endoh, Y. Nagatomo, M. Yoshimaru, F. Ichikawa, M. Ino, "1991 Symposium on VLSI Technology—Digest of Technical Papers", IEEE Cat. No. 91 CH 3017–1, pp. 9–10.

Primary Examiner—William Powell
Attorney, Agent, or Firm—Walter D. Fields

[57] ABSTRACT

A method of etching an oxide/poly/oxide sandwich structure in which both oxide layers are anisotropically etched, and the poly layer is also isotropically etched to recess the poly from the edge of the contact walls. The oxide etch can be done using oxide to nitride etch stop technology. The process is an in situ etch, that is, a single parallel plate plasma reactor is employed.

44 Claims, 2 Drawing Sheets

IN SITU ETCH PROCESS FOR INSULATING AND CONDUCTIVE MATERIALS

CROSS-REFERENCE TO RELATED APPLICATIONS

This is a continuation application of U.S. application Ser. No. 08/060,902, filed May 13, 1993, U.S. Pat. No. 5,691,246.

FIELD OF THE INVENTION

This invention relates to semiconductor manufacturing, and more particularly to an in situ method for etching insulating and conductive materials.

BACKGROUND OF THE INVENTION

An electronic circuit is chemically and physically integrated into a substrate, such as a silicon wafer by patterning regions in the substrate, and by patterning layers on the substrate. These regions and layers can be conductive, for conductor and resistor fabrication, or insulative, for insulator and capacitor fabrication. They can also be of differing conductivity types, which is essential for transistor and diode fabrication.

Degrees of resistance, capacitance, and conductivity are controllable, as are the physical dimensions and locations of the patterned regions and layers, making circuit integration possible. Fabrication can be quite complex and time consuming, and therefore expensive. It is thus a continuing quest of those in the semiconductor fabrication industry to reduce fabrication times and costs of such devices in order to increase profits. Any simplified processing step or combination of processes at a single location becomes a competitive advantage.

A common requirement in integrated circuit (IC) fabrication is the etching of a "sandwich" structure such as a layer of silicon dioxide ("oxide") over a layer of polycrystalline silicon ("poly") over a layer of thin oxide (often called "gate oxide", because of its frequent use in transistor gates). Oxide is an insulator with dielectric properties. Poly is resistive in nature, but is made less resistive when doped with an element, such as phosphorus, having less or more than 4 valence electrons.

Two basic types of etch techniques can be used; chemical or "wet", and plasma or "dry". Etch chemistries for oxide and for poly are well known. Ordinarily, a mask layer is first deposited on a layer to be etched, and a mask opening made in the mask layer by photolithographic means, exposing a portion of the layer to be etched. An appropriate etch technique and chemistry is employed, which acts only on the exposed portion.

Difficulties may arise when more than one layer is desired etched at a single site because of different requirements for each: an etch chemistry for the bottom layer may interfere with a layer already etched through and exposed along the sidewall. Often these difficulties require changes between wet and dry techniques, and different types of etchers.

It is desirable to etch multiple layers at a single processing site. Less handling of the IC is required, which reduces handling errors, as well as the number of particle caused defects. Less masking steps may also be required, which directly reduces fabrication costs.

Both oxide and poly can be etched in a single parallel plate plasma reactor chamber. However, an oxide is typically etched in fluorine deficient fluorocarbon based plasmas, whereas poly is often etched in fluorine or chlorine based plasmas. Reactor electrode materials may also differ.

If a single-chamber process were attempted using conventional art to etch an oxide/poly sandwich structure, the erodible electrode required for oxide etch would be destroyed by the poly etchants. Using conventional methods, the two steps are not profitably compatible.

Some current manufacturing processes etch the oxide/poly/oxide structure in three separate etch chambers. Such technology involves etching the top oxide layer in an oxide etch chamber, then moving the wafer to a poly etch chamber for the poly etch, and then again moving the wafer back to the oxide chamber to etch the last oxide layer.

It is therefore desirable to etch an oxide/poly/oxide sandwich "in situ", that is, performing all required steps within a single etch chamber, under continuous vacuum conditions, in the same process run.

The following patents describe in situ etch processes of various conductive and insulative materials: U.S. Pat. No. 4,939,105 to Langley; U.S. Pat. No. 5,013,398 to Long, et al.; U.S. Pat. No. 5,094,712 to Becker, et al.; and U.S. Pat. No. 5,271,799 to Langley, all assigned to Micron Technology, Inc. The above-cited patents are all very worthwhile, describing anisotropic methods of etching.

The process of the present invention is also useful in etching contacts for metalization. The process of the present invention further provides for an isotropic polysilicon etch.

The polysilicon (which is a conductor) is undercut to provide some margin in which to place an insulating material, such as a nitride, thereby separating the polysilicon from the conductive material which is subsequently disposed in the contact hole created by the process of the present invention.

One embodiment of process of the present invention also includes a selective oxide to nitride etch chemistry (See also, "A Method of Obtaining High Oxide to Nitride Selectivity in an MERIE Reactor," *Electrochemical Society. Inc. Conference*, May 1993, authored by the inventors of the present application, as well as U.S. Pat. No. 5,286,344, issued to Blalock et al, and assigned to Micron Technology).

SUMMARY OF THE INVENTION

The process of the present invention provides for etching through and isotropically undercutting a poly layer while etching an oxide/poly/oxide sandwich to form a contact. This etch is done in situ, that is, using a single parallel plate plasma reactor.

The process of the present invention is useful for etching an oxide/poly/oxide sandwich contact structure, and involves creating plasmas in which the oxide layers are anisotropically etched. Additionally, a plasma is created in which the poly layer is isotropically etched to recess the poly from the edge of the contact walls.

In one embodiment of the process of the present invention, the oxide layer superjacent the substrate is etched using an oxide to nitride etch stop technology.

Naturally, when one atmosphere is purged and another is introduced, a gas stability step is provided to guarantee a stable new atmosphere. These are well known to those familiar with this type of equipment and will not be further detailed.

One advantage of the process of the present invention is the reduced cycle time to accomplish contact hole formation.

Another advantage of the process of the present invention is the increase in yield which results from the reduction in defect densities. The wafer is handled less because the process is carried out in situ, thereby providing fewer opportunities for contamination.

BRIEF DESCRIPTION OF THE DRAWINGS

The present invention will be better understood from reading the following description of non-limitative embodiments, with reference to the attached drawings, wherein below.

DETAILED DESCRIPTION OF THE INVENTION

Figure 1:
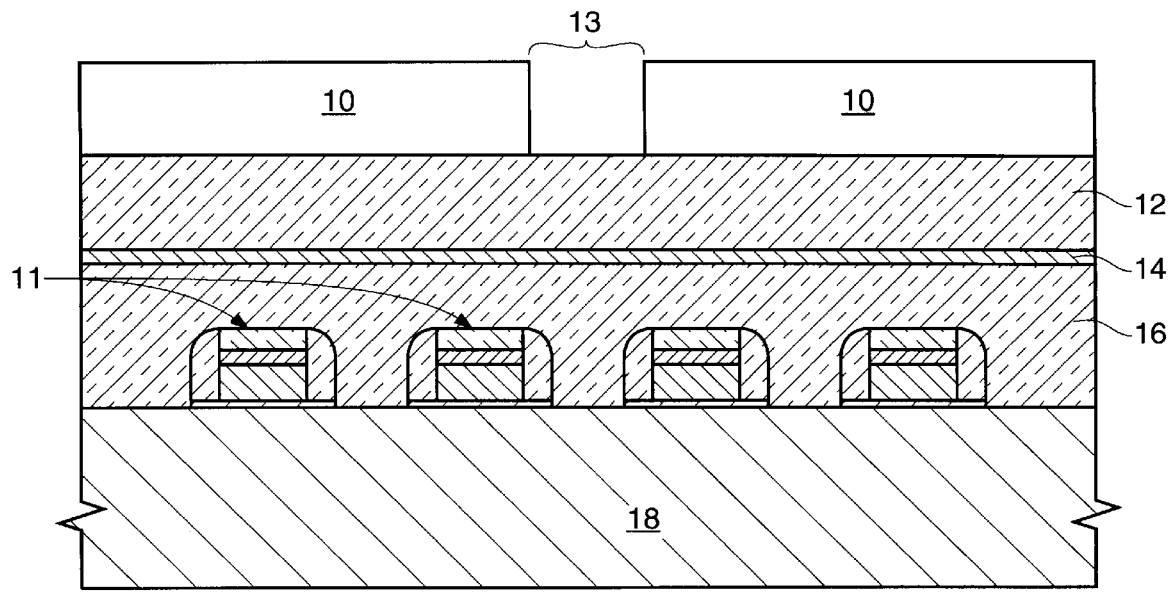
FIG. 1 is a schematic cross-section of a substrate having insulating and conductive layers and a patterned resist disposed thereon, according to the process of the present invention.

A photolithography process defines a contact hole 13 above the sandwich material comprising; an insulator 12, such as, an oxide or a nitride, including, but not limited to, silicon dioxide, TEOS, and BPSG; a conductive layer 14, such as polysilicon; and another insulator 16. The sandwich structure is disposed on a substrate 18 (in the illustrative embodiment, the substrate 18 is a silicon wafer, having a diameter of approximately 180 mm).

As illustrated in FIG. 1, a photoresist mask layer 10 is aligned and developed on a sandwich structure. In the preferred embodiment, the sandwich structure is comprised of an oxide layer 12 of approximately 10 kÅ, a poly layer 14 of approximately 1 kÅ, and a gate oxide layer 16 of approximately 10 kÅ, on a silicon wafer substrate 18. In the illustrative embodiment, the sandwich structure is disposed upon word lines 11 fabricated on the substrate 18.

The word lines 11 are comprised of an oxide or nitride/ $WSi_x$/poly, gate oxide which requires greater selectivity during the etch process which removes layer 16.

Deposition and masking of the sandwich structure are done by methods well known to those skilled in semiconductor design and processing, and hence, are not fully disclosed herein.

Oxide etch, in general, is fairly well understood, given a universal need for a vertical profile. This vertical profile is realized primarily by ion induced reaction with the oxide, coupled with normal incidence of the ions onto the oxide surface. The amount and energy of these ions are primarily controlled by the reactor's RF power and pressure.

Generally, a fluorocarbon-based gas mixture is introduced at a low pressure into the etch chamber. The exact gas composition is chosen, so that the fluorine-to-carbon ratio is near, but not beyond, the so-called polymerization point. Under these conditions, when a plasma is ignited, the fluorocarbons are dissociated and release fluorine radicals and $CF_X$ species.

Although fluorine radicals etch oxide, they do so very slowly: the primary etchant for oxide is considered to be the $CF_X$ species. Some of these species diffuse to the oxide surface where, with the assistance of ion bombardment, they react with the oxide and release volatile byproducts $SiF_4$, CO, and $CO_2$. In addition, some of the $CF_X$ species react with each other to form fluorocarbon polymers. Polymer that forms on horizontal surfaces is removed by vertical ion bombardment. Polymer that forms on vertical sidewalls is not significantly degraded by the bombardment, and actually serves a useful purpose by protecting the sidewalls from attack by the etchant species. This sidewall protection enables the achievement of vertical profiles, adjustable by varying the fluorine-to-carbon ratio. A polymer-producing gas such as $CHF_3$, is balanced against a fluorine producing gas such as $CF_4$, to provide proper selectivity, with assistance to sidewall protection.

A parallel-plate plasma reactor can etch both the oxide layers 12, 16 and the polysilicon layer 14 in one chamber. The preferred embodiment of the process of the present invention is done in an AME 5000 MERIE (magnetically enhanced reactive ion etching plasma reactor), sold by Applied Materials Corporation of Santa Clara, Calif. A fixed gap between an anodized aluminum cathode and the anode is preferred.

The wafers (substrate 18) sit on an O-ring in the chamber. There is a flow of helium to the back of the wafer 18 which provides a more consistent cooling of the wafer 18 during the plasma etch. This is a much superior method than just placing the wafer 18 on a water cooled electrode. This is also true with the poly 14 etch processes.

Figure 2:
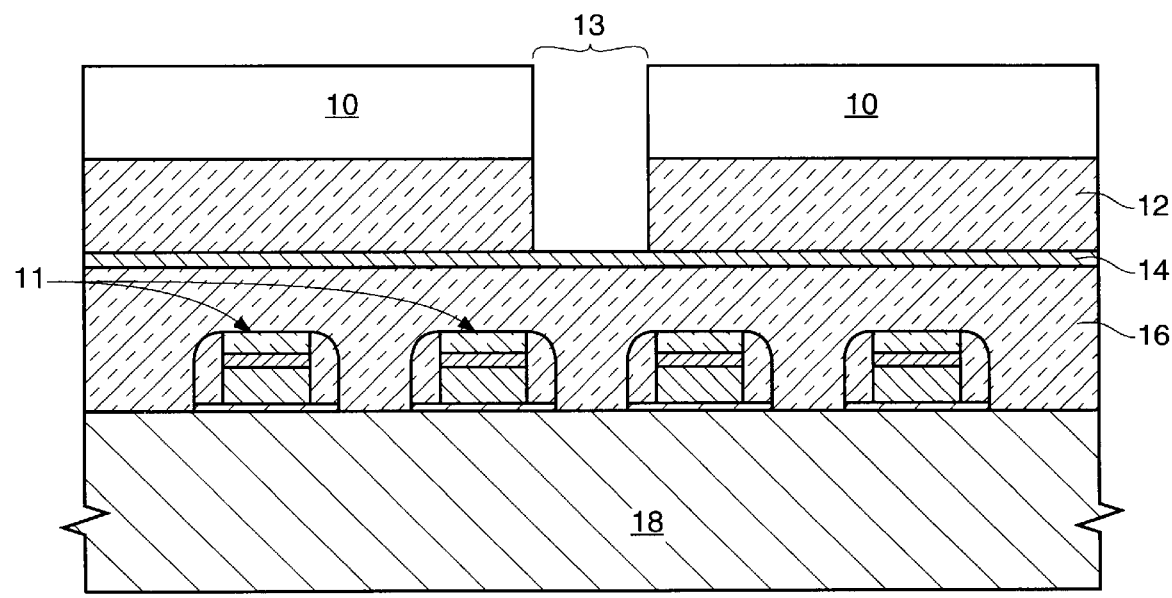
FIG. 2 is a schematic cross-section of the layered substrate of FIG. 1, after the first insulating layer has been etched, according to the process of the present invention.

FIG. 2 illustrates the substantially anisotropic oxide etch which stops on the 1 kÅ poly layer 14. During oxide 12 etch, the exposed oxide 12 is preferably etched by a plasma characterized by a power density of approximately 700 W, a magnetic field of approximately 75 gauss, and an atmosphere of approximately 100 mTorr comprised of approximately 25 sccm $CF_4$, approximately 35 sccm $CHF_3$, and approximately 60 sccm argon. The argon functions to enhance the uniformity of the etch, and is selected for its cost and availability. One having ordinary skill in the art would realize that other inert gases could also be used in the process of the present invention, as well as the various combinations of fluorocarbon based gases such as $C_2F_6$, which are useful for anisotropically etching an oxide.

Figure 3:
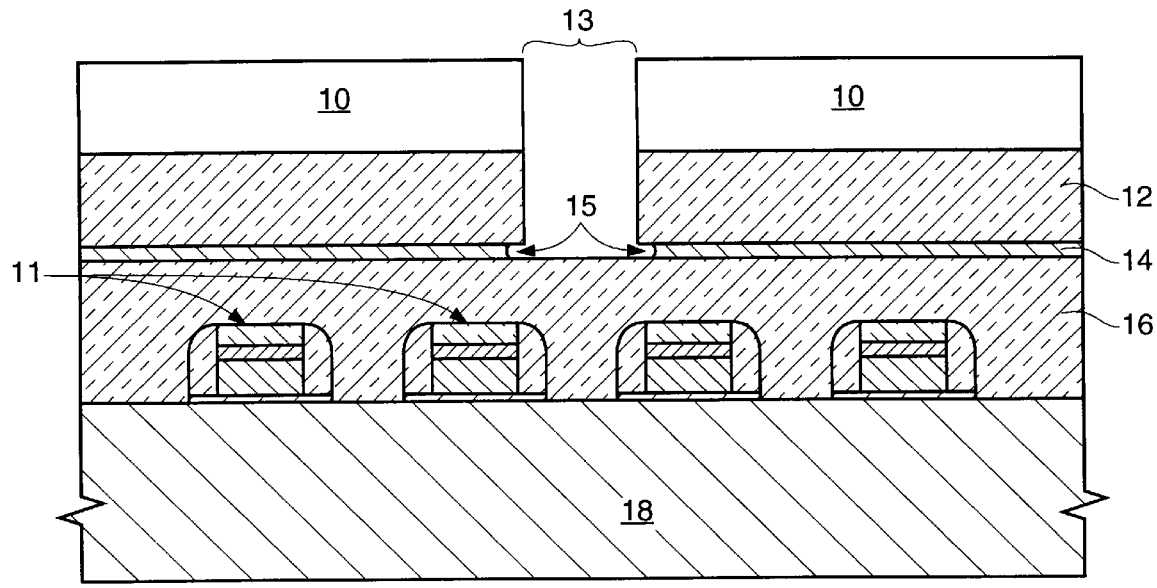
FIG. 3 is a schematic cross-section of the layered substrate of FIG. 2, after the conductive layer has been etched, according to the process of the present invention.

Immediately after the oxide 12 etch step, while in situ, the poly silicon layer 14 is etched with a two-step process. FIG. 3 illustrates the combination of a substantially anisotropic etch and an isotropic poly layer 14 etch which is performed to etch through, and then undercut 15 the poly layer 14. The etch employs a halogen such as $Cl_2$, $Br_2$, $F_2$ and/or $I_2$, and preferably $Cl_2$. The resulting poly layer 14 profile is slightly indented 15 (preferably to approximately 1 kÅ) between the upper and lower oxide layers 12, 14, respectively.

The preferred parameters for the substantially anisotropic portion of the poly layer 14 etch are characterized by a power density of approximately 300 W, a magnetic field of approximately 150 gauss, and an atmosphere of approximately 25 mTorr comprised of approximately 30 sccm $Cl_2$, and approximately 4 sccm $SF_6$.

The preferred parameters for the isotropic portion of the poly layer 14 etch are characterized by a power density of approximately 125 W, a magnetic field of approximately 0 gauss, and an atmosphere of approximately 400 mTorr comprised of approximately 20 sccm $Cl_2$, approximately 5 sccm $He/O_2$, and approximately 30 sccm $SF_6$.

The preferred embodiment of process of the present invention employs the combination of isotropic and anisotropic etches to undercut 15 the polysilicon layer 14. An alternative embodiment includes reversing the order of the anisotropic and isotropic etch steps. A further embodiment is simply to undercut the polysilicon layer 14 with an isotropic etch alone.

Figure 4:
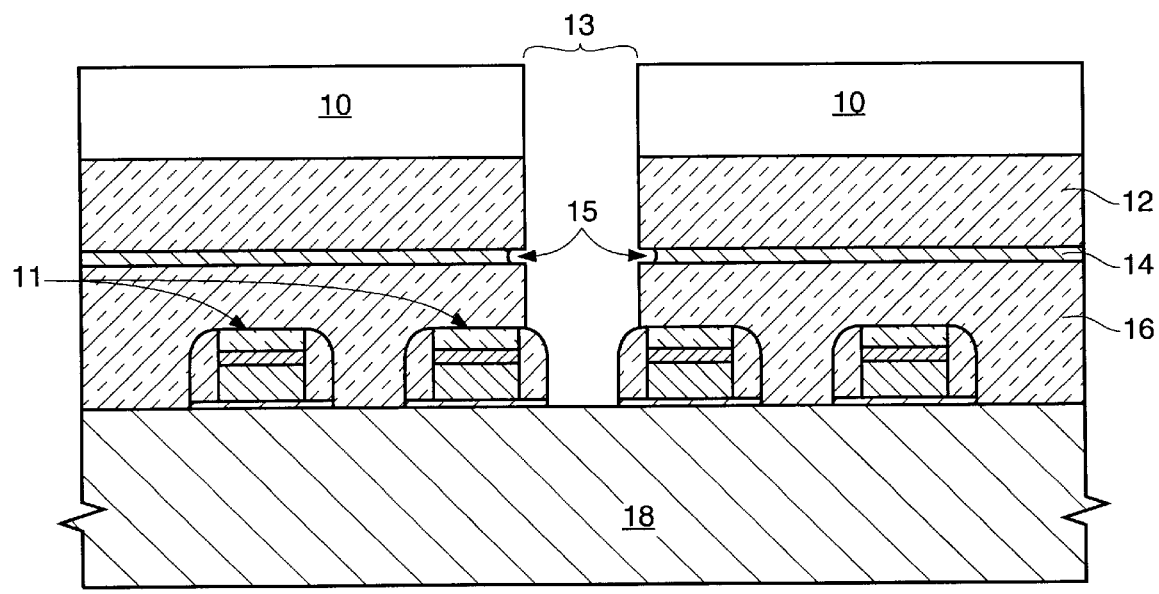
FIG. 4 is a schematic cross-section of the layered substrate of FIG. 3, after the second insulating layer has been etched, according to the process of the present invention.

FIG. 4 illustrates the etch of the lower oxide layer 16 on which a low selective etch is performed until the contact hole 13 reaches the top of the underlying wordlines 11.

During the selective oxide 16 etch, the exposed oxide 16 is preferably etched by a plasma characterized by a power density of approximately 700 W, a magnetic field of approximately 75 gauss, and an atmosphere of approximately 100 mTorr comprised of approximately 25 sccm $CF_4$, approximately 35 sccm $CHF_3$, and approximately 60 sccm argon. Again, $C_2H_6$ may also be included for assisting the oxide etch.

In the case in which the word line 11 is comprised of a nitride film, an alternative embodiment, is to then change the to a high oxide to nitride selective etch so, that the oxide layer 16 can be removed at the bottom of the contact hole 13 without exposing the wordline 11. U.S. Pat. No. 5,286,344, issued to blalock et al, and assigned to Micron Technology, Inc., entitled, "Process for Selectively Etching a Layer of Silicon Dioxide on an Underlying Stop Layer of Silicon Nitride" also provides additional description of this etch step.

Once the contact hole 13 is created, an oxidation step may be undertaken to insulate the sides of the contact holes 13 prior to the deposition of a conductive material which conductive material will function as contacts. The indented portion 15 of the contact hole 13 enables the separation of the conductive poly layer 14 from the metal contact, while essentially maintaining a substantially vertical profile. The insulation lining the contact simply fills the indentation 15, and therefore does not significantly encroaching into the contact hole 13.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that a poly equivalent in this process is a refractory metal silicide, such as tungsten silicide. Although the structure disclosed included BPSG derived oxide, tetraethylorthosilicate (TEOS) or any silane derived oxide, for example, may be etched. Nitride of silicon is also considered equivalent to oxide for purposes of the inventive process. These equivalents and others are intended to be circumscribed by these claims.

What is claimed is:

1. A method of forming an opening through an insulator/conductor/insulator layered structure within a single reactor chamber, said method comprising steps of:

providing a layered structure comprising a first insulator layer, a conductor layer disposed over the fist insulator layer, and a second insulator layer disposed over the conductor layer;

disposing said layered structure in a reactor chamber;

establishing a first atmosphere in said reactor chamber to remove a portion of the second insulator layer, creating, per a cross-sectional view thereof, an edge profile in the second insulator layer and exposing at least a portion of the conductor layer;

changing the atmosphere inside said reactor chamber to a second atmosphere to remove a portion of the conductor layer and expose a portion of the first insulator layer;

changing the atmosphere inside said reactor chamber to a third atmosphere to remove a portion of the first insulator layer, thereby creating, per a cross-sectional view thereof, an edge profile in the first insulator layer; and said second atmosphere removing portions of said conductor layer beneath the second insulator layer so as to form a hollowed in-set beneath said second insulating layer.

2. The method according to claim 1, further comprising the step of:

lining said opening of said layered structure with an electrically insulating material.

3. The method according to claim 1, wherein said first and third atmospheres comprise a fluorocarbon, said fluorocarbon comprising at least one of $CF_4$, $CHF_3$, and $C_2F_6$.

4. The method according to claim 3, wherein said second atmosphere comprises a halogenated species, said halogenated species comprising at least one of $Cl_2$, $Br_2$, $F_2$, and $I_2$.

5. The method according to claim 4, wherein said layered structure comprises an oxide/polysilicon/oxide layered structure.

6. A process for forming a void in a multilayered structure, said process comprising steps of:

providing a layered substrate having an oxide/polysilicon/oxide layered structure;

providing a pattern layer over said layered substrate disposing said layered substrate within a chamber; and removing respective portions of said oxide/polysilicon/oxide layers of said layered structure within said chamber in accordance with said pattern layer, thereby creating at least one void in said layered structure, said at least one void having, per a cross-sectional view thereof, an edge profile;

wherein said step of removing comprises steps of:

anisotropically etching at least one layer of said oxide layers of said layered structure within said chamber, and isotropically etching said polysilicon layer of said substrate within said chamber during the formation of said void so as to create said edge profile with at least a slight undercut at said polysilicon layer.

7. The process according to claim 6, wherein said step of isotropically etching said poly-silicon employs a plasma comprising a halogenated species.

8. The process according to claim 7, wherein said halogenated species comprises a gas flow of $Cl_2$, in a range of 10–40 sccm.

9. The process according to claim 8, wherein said plasma further comprises an inert gas.

10. The process according to claim 6, further comprising steps of:

lining at least a portion of said void with an insulator, and subsequently disposing a conductive material within said lined void.

11. A method according to claim 6, wherein said step of removing further comprises a step of anisotropically etching a preliminary portion of said polysilicon layer of said layered structure within said chamber before said step of isotropically etching.

12. A method of forming a contact opening in a layered substrate, comprising steps of:

providing a layered substrate comprising:

a substrate;

a first insulator layer disposed over said substrate;

a conductor layer disposed over said first insulator layer;

a second insulator layer disposed over said conductor layer; and a mask layer disposed over said second insulator layer, said mask layer having at least one mask opening;

placing said layered substrate within a reaction chamber; and etching an opening into said layered substrate within said reactor chamber, said etching comprising:

etching a portion of said second insulator layer, in accordance with said mask layer, using a first plasma to expose a portion of said conductor layer, removing a portion of said conductor layer using a second plasma to expose a portion of said first insulator layer, said removal with said second plasma includes removing a portion of said conductor layer beneath said second insulator layer, thereby forming an undercut beneath said second insulator layer, and exposing said layered substrate to a third plasma to remove a portion of said first insulator layer and expose a portion of said substrate; and lining at least a portion of said opening in said layered substrate with an electrically insulating material.

13. A method according to claim 12, further comprising disposing a conductive material within said opening.

14. A method according to claim 13, wherein said step of lining comprises a step of oxidizing said layered substrate prior to said step of disposing a conductive material within said opening.

15. A method according to claim 14, wherein said conductor layer comprises at least one of polysilicon and a refractory metal silicide.

16. A method according to claim 14, wherein at least one of said first insulator layer and said second insulator layer comprises at least one an oxide and a nitride.

17. A method according to claim 12, wherein said step of removing said portion of said conductor layer further comprises exposing said layered substrate to a fourth plasma.

18. A method according to claim 17, wherein at least one of said second plasma and said fourth plasma provides substantially an isotropic etch of said conductor layer.

19. A method according to claim 18, wherein at least one of said second and said fourth plasma comprises a halogenated species.

20. A method according to claim 19, wherein at least one of said first plasma and said third plasma comprises a fluorocarbon.

21. A method according to claim 20, wherein said at least one of said first plasma and said third plasma further comprises an inert gas.

22. A method according to claim 17, wherein one of said second plasma and said fourth plasma provides an anisotropic etch of said conductor layer, and the other of said second plasma and said fourth plasma provides primarily an isotropic etch of said conductor layer.

23. A method according to claim 12, wherein said first plasma provides an anisotropic etch of said second insulator layer.

24. A method according to claim 12, wherein said third plasma provides an anisotropic etch of said first insulator layer.

25. A method according to claim 12, wherein said first plasma provides an anisotropic etch of said second insulator layer; wherein said second plasma provides an isotropic etch of said conductor layer; and wherein said third plasma provides an anisotropic etch of said first insulator layer.

26. A method according to claim 25, wherein said third plasma etches said first insulator layer preferentially relative to said substrate.

27. Method of forming a recess within a layered substrate, said method comprising steps of:

providing a substrate comprising a first insulator layer;

providing an electrically conductive layer over said first insulator layer;

providing a second insulator layer over said conductive layer;

providing a mask layer having at least one opening over said second insulator layer;

disposing said layered substrate within a chamber;

etching, in accordance with said at least one opening of said mask layer, a portion of said second insulator layer of said layered substrate within said chamber, said etching using a first plasma, thereby exposing a portion of said conductive layer;

removing a portion of said conductive layer of said layered substrate within said chamber using a second plasma to expose a portion of said first insulator layer, said removing includes removing a portion of said conductive layer beneath said second insulator layer to form an undercut beneath said second insulator layer;

exposing said layered substrate within said chamber to a third plasma to remove a portion of said first insulator layer, thereby forming said recess within said layered substrate; and disposing an insulating material within said undercut adjacent said conductive layer.

28. A method according to claim 27, further comprising the step of disposing a conductive material within said recess.

29. A method according to claim 27, wherein said step of disposing an insulating material comprises a step of oxidizing said exposed conductive layer at said undercut.

30. A method according to claim 27, wherein said conductive layer comprises at least one of polysilicon and a refractory metal silicide.

31. A method according to claim 27, wherein at least one of said first insulating layer and said second insulating layer comprises at least one of the group consisting essentially of an oxide and a nitride.

32. A method according to claim 27, wherein said step of removing said portion of said conductive layer further comprises the step of exposing said layered substrate to a fourth plasma.

33. A method according to claim 32, wherein at least one of said second plasma and said fourth plasma provides substantially an isotropic etch of said conductive layer.

34. A method according to claim 32, wherein one of said second plasma and said fourth plasma provides an anisotropic etch of said conductive layer, and the other of said second plasma and said fourth plasma provides primarily an isotropic etch of said conductive layer.

35. A method according to claim 34, wherein said step of exposing said layered substrate to said fourth plasma is performed after said step of etching said second insulator layer.

36. The process according to claim 34, wherein said step of anisotropically etching employs a halogenated plasma in an atmosphere having a pressure in a range of 15–30 mtorr and an applied power in a range of 250–350 Watts and a magnetic field in a range of 100–200 gauss.

37. The process according to claim 36, wherein said step of isotropically etching employs a halogenated plasma in an atmosphere having a pressure in a range of 300–500 mtorr and an applied power in a range of 100–150 Watts.

38. A method of forming at least one contact hole for a layered substrate, comprising steps of:

providing a substrate comprising nitride;

providing a first oxide layer over said substrate, covering said nitride;

providing a conductor layer over said first oxide layer;

providing a second oxide layer over said conductor layer;

providing a mask layer over said second oxide layer, said mask layer having at least one opening;

placing said layered substrate within a reactor chamber;

exposing said layered substrate within said reactor chamber to a first plasma to remove in accordance with said mask layer a portion of said second oxide layer and expose a portion of said conductor layer;

etching said conductor layer of said layered substrate within said reactor chamber using a second plasma to remove a portion of said conductor layer and expose a portion of said oxide layer; and selectively etching said first oxide layer of said layered substrate within said reactor chamber to remove a portion of said first oxide layer selectively with respect to nitride, thereby forming at least one contact hole.

39. A method according to claim 38, wherein said step of selectively etching employs a third plasma that etches said first oxide layer substantially anisotropically.

40. A method according to claim 39, wherein said third plasma comprises a fluorocarbon.

41. A method according to claim 38, wherein said step of selectively etching comprises steps of first etching said first oxide layer substantially anisotropically, and thereafter changing the etch to increase an oxide-to-nitride selectivity thereof.

42. A method according to claim 38, wherein said step of exposing said conductor layer removes a portion of said conductor layer beneath said second oxide layer, thereby forming an undercut beneath said second oxide layer.

43. A method according to claim 38, wherein said first plasma provides a selective removal of said portion of said second oxide layer relative said conductor layer.

44. A method according to claim 43, wherein said first plasma comprises a fluorocarbon and provides a substantially anisotropic etch of said second oxide layer.

* * * * *